US007777755B2

(12) United States Patent
Marcu et al.

(10) Patent No.: US 7,777,755 B2
(45) Date of Patent: Aug. 17, 2010

(54) DISPLAY DEVICE CALIBRATION SYSTEM

(75) Inventors: Gabriel G. Marcu, San Jose, CA (US); Wei Chen, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 524 days.

(21) Appl. No.: 11/766,774

(22) Filed: Jun. 21, 2007

(65) Prior Publication Data

US 2008/0316222 A1 Dec. 25, 2008

(51) Int. Cl.

| | |
|---|---|
| ***G09G 5/00*** | (2006.01) |
| ***G09G 5/02*** | (2006.01) |
| ***G03F 3/08*** | (2006.01) |
| ***G06F 15/00*** | (2006.01) |
| ***H04N 5/445*** | (2006.01) |
| ***H04N 5/57*** | (2006.01) |
| ***H04N 1/46*** | (2006.01) |
| *H04N 9/70* | (2006.01) |
| *G01P 3/00* | (2006.01) |
| *G01D 21/00* | (2006.01) |

(52) U.S. Cl. ....................... 345/581; 345/589; 345/204; 345/606; 345/690; 348/252; 348/560; 348/602; 348/802; 358/518; 358/525; 382/167; 382/274; 382/276; 702/85; 702/127; 702/147

(58) Field of Classification Search ................. 345/426, 345/428, 581, 589, 606, 619, 442, 204, 690, 345/38-39, 48, 63, 77, 88, 643-644, 522, 345/530-531, 538, 561, 548-549; 348/252-257, 348/552, 560, 602, 802; 358/516-518, 519-522, 358/525, 461; 702/4, 85-86, 94-95, 127, 702/147, 155, 189, 194-199; 382/162, 167, 382/254, 274, 300
See application file for complete search history.

(56) References Cited

U.S. PATENT DOCUMENTS

| | | | | |
|---|---|---|---|---|
| 5,208,911 | A * | 5/1993 | Newman et al. | 345/600 |
| 5,432,906 | A * | 7/1995 | Newman et al. | 345/501 |
| 2009/0002785 | A1 * | 1/2009 | Marcu et al. | 358/525 |

* cited by examiner

*Primary Examiner*—Sajous Wesner
(74) *Attorney, Agent, or Firm*—Morrison & Foerster LLP

(57) ABSTRACT

A display device calibration system is provided. The overall color response of a display family is characterized, and the idiosyncratic color response characteristics of the display family are determined. The idiosyncratic color response characteristics of the display family are related to respective idiosyncratic color response points. Individual idiosyncratic color response point values for an individual member of the display family are determined. The color response of the individual member of the display family is specified from the individual idiosyncratic color response point values of the individual member of the display family and the overall color response of the display family.

57 Claims, 6 Drawing Sheets

DISPLAY DEVICE CALIBRATION SYSTEM

TECHNICAL FIELD

The present invention relates generally to display devices, and more particularly to a reduced measurement display device calibration system.

BACKGROUND ART

With the advance of display systems illumination technology from incandescent to fluorescent to solid-state light sources, and with ever-increasing miniaturization, one popular electronic category seems not to have kept pace. That category is large-sized personal data displays, such as personal computer monitors.

For many years, such monitors were based on cathode ray tube ("CRT") technology. More recently, flat panel displays have increasingly displaced CRT displays. The most common form of flat panel displays utilizes one or more fluorescent light sources located behind a liquid crystal display ("LCD") screen. Contemporary technology has enabled the use of cold cathode fluorescent light ("CCFL") light sources, but because a cathode emitter is still required, a high voltage source for striking and maintaining an electric arc through the CCFL is also required.

With continuing improvements in light-emitting diode ("LED") technology, such as substantial improvements in brightness, energy efficiency, color range, life expectancy, durability, robustness, and continual reductions in cost, LEDs have increasingly been of interest for superseding CCFLs in larger computer displays. Indeed, LEDs have already been widely adopted as the preferred light source in smaller display devices, such as those found on portable cellular telephones, personal data assistants ("PDAs"), personal music devices (such as Apple Inc.'s iPod®), and so forth.

One reason for preferring LED light sources to CCFL backlight light sources is the substantially larger color gamma that can be provided by LED light sources. Typically, an LCD display that is illuminated by a CCFL backlight produces about 72-74 percent of the color gamma of a CRT-based NTSC display. ("NTSC" is the analog television system in use in Canada, Japan, South Korea, the Philippines, the United States, and some other countries.) Current LED backlight display technology, however, has the potential of producing 104-118 percent or more of that gamma color space.

Another reason for not preferring CCFL bulbs is that they contain environmentally unfriendly mercury, which could be advantageously eliminated if an acceptable LED backlight light source configuration could be developed for larger displays.

When implemented in small displays such as just described, the technical requirements are readily met. As is known in the art, the illumination intensity can be rendered uniform by distributing LED light sources around the periphery of the display and utilizing light diffusing layers behind the display to equalize the display intensity. The technical challenges are modest because the screens are modest in size, so that the individual display pixels are never very far from one or more of the LED light sources. Light attenuation caused by distance from the LED light sources is therefore not great and is readily equalized by appropriate LED positioning coupled with suitable light diffusers behind the display.

One way to envision the ease with which this challenge can be met in smaller displays is to consider the number of pixels, on average, that each LED light source must support in the display, and the maximum distances per pixel that the most distant pixels are located relative to a given LED light source. These numbers are modest (perhaps in the hundreds), so the light diminution or attenuation for the most distant pixels is similarly modest and readily compensated by suitable diffuser designs.

On the other hand, the larger geometries of typical flat panel computer monitors and displays (e.g., larger than about 20 inches) create area-to-perimeter ratios that have proven untenable for current LED technologies, particularly with respect to LED brightness or light output. This has meant that it has proven unsatisfactory to attempt to replace CCFL light sources with LED light sources along one or more edges of such larger display screens. Accordingly, such displays continue to employ CCFL light sources even though CCFL light sources are increasingly less desirable than LED light sources.

It would seem that a straightforward solution for replacing CCFL light sources with LEDs would then be to arrange the LEDs in some sort of array configuration behind the LCD display screen, rather than around the perimeter. Prior attempts to do so, however, have proven unsatisfactory. Commercially viable displays for general consumption must be economical to manufacture, thin, lightweight, must provide efficient thermal management capability, and must provide consistent and uniform color quality and brightness throughout the display, all at reasonable costs. Attempts to meet these criteria in acceptable form factors and costs have been unsuccessful.

Previous efforts to achieve these objectives have failed due to a number of practical obstacles. For example, even though LED light outputs have dramatically improved in recent years, a very large number of LEDs is still required to provide sufficient brightness in such larger displays. Typically, a minimum of several hundred LEDs must be used. This then requires an enormously large maze of wires and/or bulky circuit boards to mount, support, and power such a large number of LEDs in a distributed matrix configuration. This in turn requires adequate mechanical structure to support all those components behind the LED screen. The resulting structure is bulky, thick, heavy, and not well suited for managing and removing the heat that is generated by the LEDs and the underlying electrical circuitry. It is also expensive and not well suited for efficient manufacturing.

Another challenge with utilizing LEDs in large arrays is maintaining uniformity of color in the large numbers of LEDs. The color balance and spectra of the LEDs is limited by the phosphorescence. For example, white LEDs are often actually blue LEDs with a complementary phosphor dot on the front of the LED. Depending upon manufacturing precision (and thus, related manufacturing costs), actual colors may vary from, for example, slightly blue to slightly pink. Understandably, reducing or compensating for such variability increases cost and complexity significantly as the number of LEDs increases in larger display configurations and environments.

The color and the output of each LED also depend fairly sensitively on temperature. The difficulties in providing proper thermal management capability can readily lead to temperature variations across the distributed array of LED light sources. Since the color qualities of LED light sources are sensitively dependent upon their operating temperatures, such non-uniformities lead to unacceptable variations in color from one portion of the display to another.

Another major obstacle to commercialization of such larger LED light source displays is the complexity and costs associated with measuring and calibrating each such display as it is being manufactured. Prior CCFL displays commonly use one, or at most just a few, CCFL light sources, so the necessary calibrations and corrections, such as color correction and gamma correction, can be easily accomplished and managed. For example, a single CCFL light source will provide uniform and homogeneous color and gamma for the entire display, so localized corrections are not usually a concern. The need for highly customized color corrections for individual displays has also been basically eliminated due to quality control advances in CCFL light source technology that has led to economical production of CCFL light sources that consistently provide reliably uniform illumination profiles.

Such is not the case with LED light source displays that include multiple LED light sources distributed at various display locations. When employed in larger displays, as previously described, the LEDs may be distributed throughout the area behind the display, and not just along the perimeter edges. This results in possible performance variations that can result from any number of causes, for example, temperature variations from one region of the display to another.

Calibration of a display may be accomplished by adjusting the imaging layer, such as a display's thin film transistor liquid crystal display ("TFT-LCD"). Calibration of the TFT-LCD to compensate for LED variability can be complex due, among other reasons, to the properties of the TFT-LCD itself. For example, there can be cross talk between color channels due to interaction properties of the LCD elements. Other calibration adjustments may be required due to non-linearities of output with brightness, asymmetrical RGB ("red, green, and blue") transfer functions for the color channels, differing gamma profiles, proper and accurate gray tracking, and so forth.

As a result, it has been important to measure and calibrate each LED light source display to establish profiles for each such display that enable compensations to be made for those intrinsic factors. Compensations can be made, for example, by appropriately changing the image renditions formed by the TFT-LCD panel of the display to reverse and neutralize the LED performance variations. The compensations can be managed, for example, by the device that controls the display (e.g., a computer) or by suitable circuitry within the display itself. However, each display must first be appropriately measured and carefully calibrated. Heretofore this has been a time-consuming and expensive process, acceptable perhaps for limited-production, "high-end" specialty displays, but not acceptable for mass-produced consumer products.

As a result, prior efforts to replace CCFL light sources with LEDs in commercial consumer applications have largely failed to move beyond the prototype stage. The complexities, manufacturing costs, bulkiness, very heavy weights, color non-uniformities, thermal management challenges, calibration complexities and costs, and so forth, have simply combined in such a way as to leave experts in the technology convinced that they must yet await the development of even significantly brighter, more uniform, and less expensive LEDs.

Consumers expect and demand an excellent, consistent, and affordable consumer experience. Prior attempts to utilize LEDs in large displays have thus not solved the problem of building displays that are light, easy and inexpensive to manufacture, uniform in color, low in cost, and that also provide the excellent overall high quality user experience that customers demand and expect.

Thus, a need still remains for better and more efficient display device calibration systems for easily, quickly, efficiently, and economically calibrating large numbers of display devices, such as in high speed, volume manufacturing environments. In view of ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a display device calibration system. The overall color response of a display family is characterized, and the idiosyncratic color response characteristics of the display family are determined. The idiosyncratic color response characteristics of the display family are related to respective idiosyncratic color response points. Individual idiosyncratic color response point values for an individual member of the display family are determined. The color response of the individual member of the display family is specified from the individual idiosyncratic color response point values of the individual member of the display family and the overall color response of the display family.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
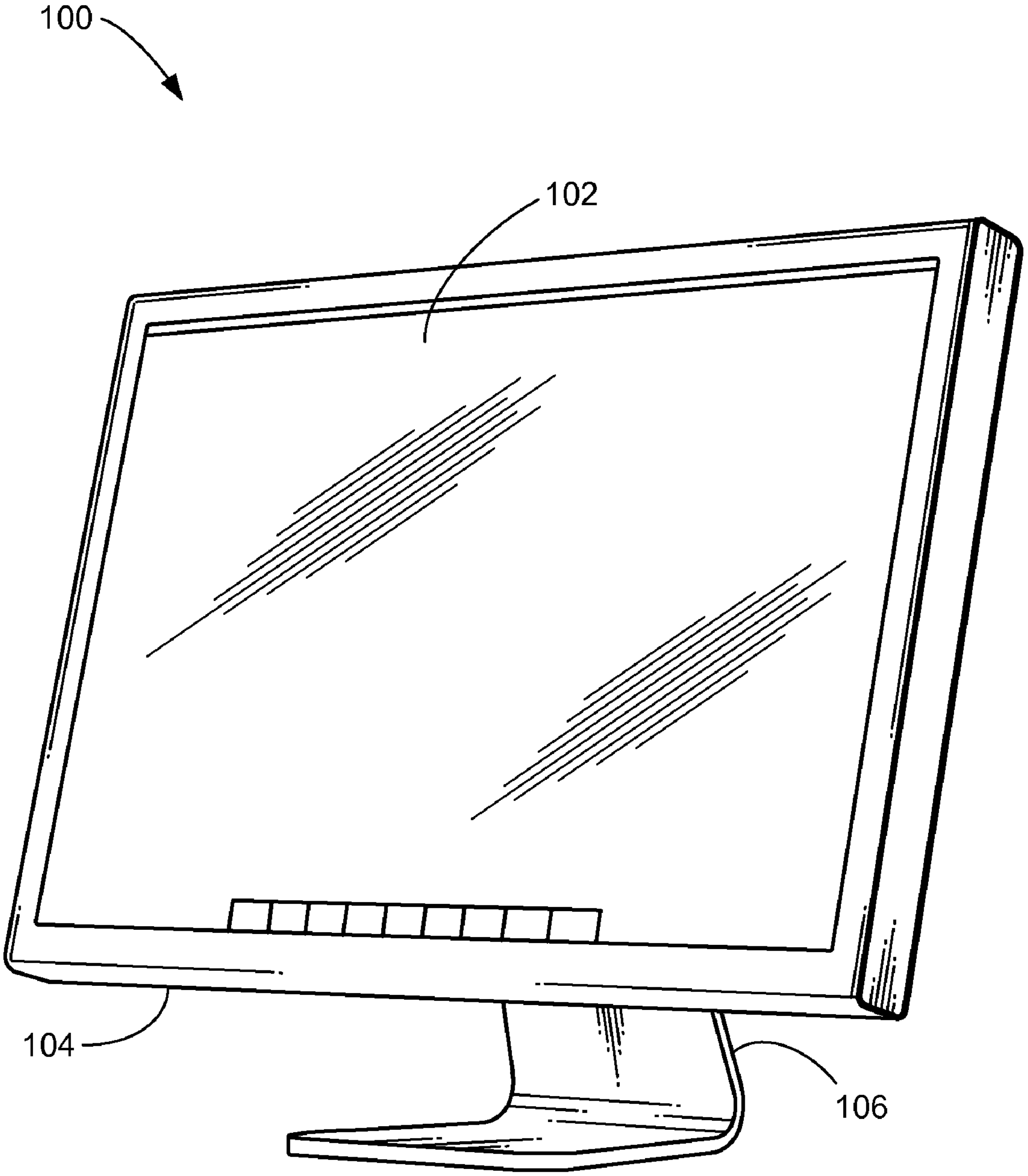
FIG. 1 is a view of a display system having a display assembly in accordance with the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail.

Similarly, the drawings showing embodiments of the system are semi-diagrammatic and not to scale and, particularly, some of the dimensions are for the clarity of presentation and are exaggerated in the drawing FIGs. Likewise, although the views in the drawings for ease of description generally show similar orientations, this depiction in the FIGs. is arbitrary for the most part. Generally, the invention can be considered, understood, and operated in any orientation.

In addition, where multiple embodiments are disclosed and described having some features in common, for clarity and ease of illustration, description, and comprehension thereof, similar and like features one to another will ordinarily be described with like reference numerals.

For expository purposes, terms, such as "above", "below", "bottom", "top", "side" (as in "sidewall"), "higher", "lower", "upper", "over", and "under", are defined with respect to the back of the display device except where the context indicates a different sense. The term "on" means that there is direct contact among elements.

The term "system" as used herein refers to and is defined as the method and as the apparatus of the present invention in accordance with the context in which the term is used.

As used herein, the terms "tile" and "tile LED light source" are defined, according to the context in which used, to mean an assembly, formed integrally on a thermally conductive substrate, with at least two similar or substantially matching LED light sources physically mounted and electrically connected thereon and configured for emitting light therefrom, and that has fewer than the total number of LED light sources utilized by the display system into which the tile is incorporated. When used with the term "tile", the term "thermally conductive" is defined to mean having thermal conduction properties comparable to or better than those of metal.

Referring now more specifically to the present invention, there are considerable concerns that arise from the use of light-emitting diodes ("LEDs") rather than cathode ray tubes ("CRTs") or cold cathode fluorescent lights ("CCFLs"). One area of concern is color uniformity and color output compensation. LEDs present unique color management challenges unlike those of earlier light source technologies, because LEDs can require finer and more complex compensations over larger color ranges. Providing such greater control can be difficult in modern flat screen displays, and can require very large numbers of calibration measurements.

For example, color liquid crystal display ("LCD") screens have complicated interactions and behaviors, such as channel cross-talk and non-linear response characteristics, that cause complex unequal color channel responses. LCDs accordingly require more complex and sophisticated control and compensation to provide true color output that compensates for LED light source variabilities.

Consequently, in order to completely describe the display product, it is necessary to gather much more information about a display that uses LED light sources. This greater information then enables accurate tracking and matching of the color input signals for proper compensation, and assures fidelity to the video signals that are input into the display.

As a result, display system calibration can be complicated, time consuming, data intensive, and expensive, particularly for LED-driven large displays. While such a high measurement burden may be acceptable, perhaps even desirable, in high-end, high-priced, specialty displays, it is unacceptable and unreasonably expensive in a mass-production, consumer-oriented product configuration.

However, it is has been unexpectedly discovered, according to the teachings of the present invention, that it is possible to readily achieve the same desired characterization precision in a consumer-oriented product with only a small fraction of the characterization measurements heretofore required. This is achieved, as explained more particularly herein, by taking the traditional large set of measurements on a small, representative number of members of a particular display family (e.g., a manufacturer's particular display model). By analyzing these measurements, a dependency function ("F") can be derived that identifies those characteristics of the color responses of the displays that are substantially common and consistently the same to all members of the measured group (the measured subgroup of the display family). Those common measurement characteristics are then characterized as the overall objective color response of the entire display family because those response characteristics of the measured subgroup are common and thus shared in common by all members of that display family. Examples of characteristics belonging to the overall color response of the display family, for example, would ordinarily be expected to include color shifts resulting from thermal environmental changes, overall relative RGB channel response functions for various illumination intensities, and so forth.

The analysis of the measurements will also reveal other response characteristics that are not generally the same, or common, to all members of the display family, but instead are unique to (i.e., uniquely different for) individual members. Such uniquely individual response characteristics are then ascribed to a class of idiosyncratic color response characteristics for the display family because the associated responses are idiosyncratic to the individual displays, and the particular measured values are therefore not shared in common by all members of the display family. Examples of idiosyncratic color response characteristics would include, for example, individual variations in actual LED color balance (e.g., true white, slightly pink, slightly blue, etc.), individual (minor) deviations in the RGB response function, variations in color quality from one region of the display to another, and so forth.

Having then characterized the overall objective color response of the display family and determined the idiosyncratic color response characteristics of the display family, the idiosyncratic color response characteristics are then related to corresponding idiosyncratic color response points. At this stage, it is then possible to characterize each individual member of the entire display family product line by measuring the values of only the corresponding idiosyncratic color response points of each such individual member.

According to the present invention, therefore, the individual idiosyncratic color response point values for each individual member of the display family are measured. From these, the entire color response of the individual member of the display family is uniquely specified from the derived dependency function F, which incorporates the overall objective color response of the display family and the refinements thereto that result from the individual idiosyncratic color response characteristics of each individual member. By then utilizing the small set of the corresponding idiosyncratic color response point measurement values and the dependency function F, and by applying the individual idiosyncratic color response point values of an individual member of the display family to the overall objective color response function F of the display family, the whole color response of the individual member of the display family is thereby efficiently specified.

By this system of the present invention, as additionally explained herein, the present invention solves the problems of fully calibrating individual display devices using reduced measurement procedures. The present invention provides a display device calibration system that exploits the extrinsic knowledge that is determined about the display family in order to minimize the amount of intrinsic information needed about each individual member of the display family.

Referring now to FIG. 1, therein is shown a display system 100 having a display assembly 102 supported in a frame 104. In turn, the frame 104 is supported on a stand 106. The display system 100 has a distributed LED backlight (not shown, but see the backlight unit 220 in FIG. 2). As used herein, the term "backlight" is defined to mean a form of illumination that provides light for a display that illuminates the display from the back of the display. This definition means that the light is presented to the side of the display opposite the side of the display that is viewed, such that the light is shining through the display toward the viewer rather than reflecting toward the viewer from the front side of the display. As used herein, the term "distributed" is defined to mean that the LED light sources of the LED backlight are positioned across and within the area of the display assembly 102, and not just around the periphery thereof adjacent the front bezel (e.g., the front bezel 202 in FIG. 2).

Figure 2:
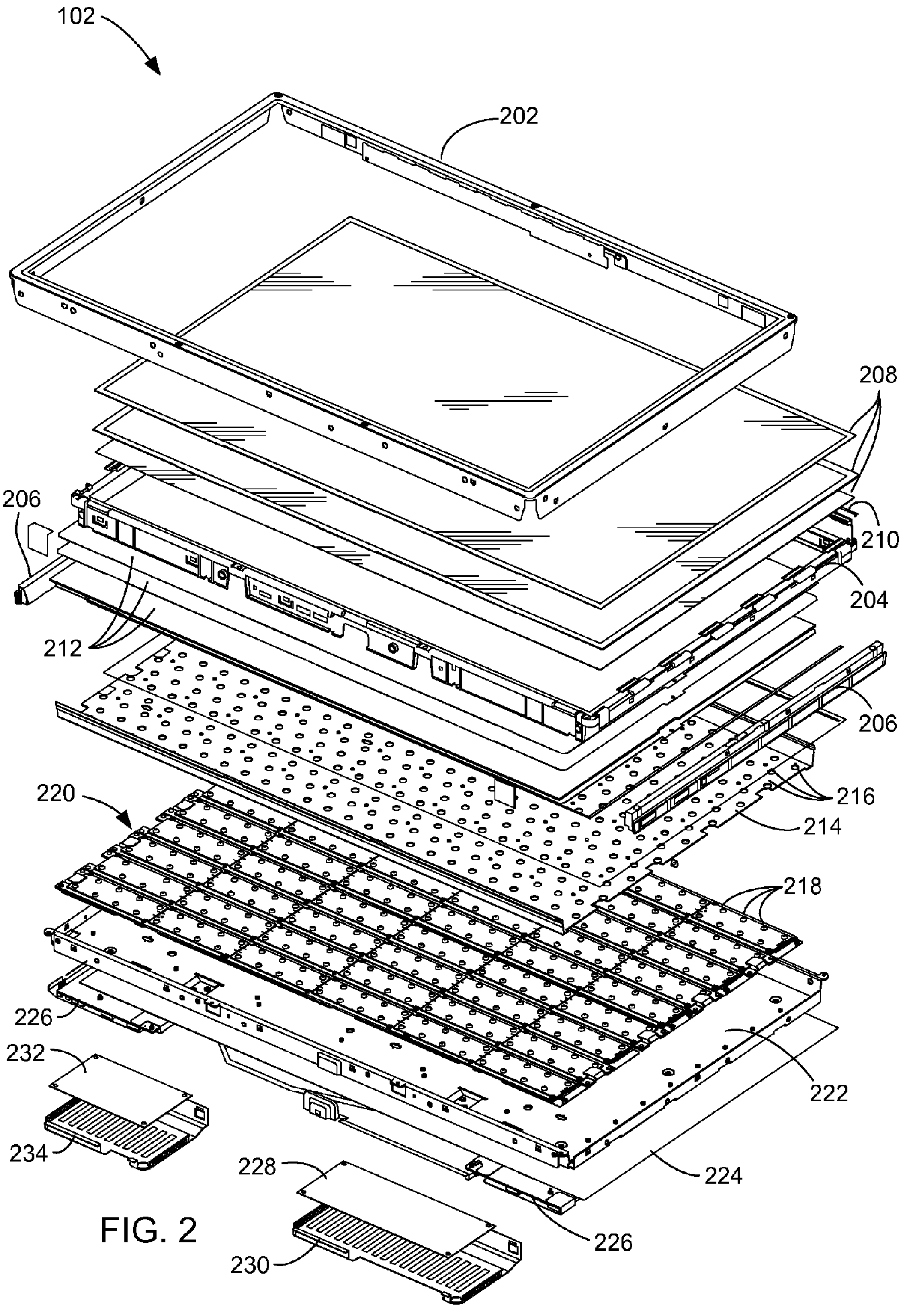
FIG. 2 is an exploded, isometric view of the majority of the major components of the display assembly in FIG. 1.

Referring now to FIG. 2, therein is shown an exploded, isometric view of the majority of the major components of the display assembly 102. The frame 104 (FIG. 1) includes a front bezel 202, a panel frame 204, and panel side rails 206.

The display assembly 102 also includes an LCD sub-assembly 208 that connects to LCD circuitry 210. In one embodiment, the LCD sub-assembly 208 utilizes thin film transistor ("TFT") technology to form a TFT LCD display, as is known in the art.

Beneath the LCD sub-assembly 208 are backlight diffuser sheets 212, beneath which is a reflector 214 having holes 216 therein that receive LEDs 218 on a backlight unit 220. The reflector 214 is thus positioned around the LEDs 218. The LEDs 218 are oriented forwardly toward the LCD sub-assembly 208 for illuminating the display assembly 102 from the back of the display.

The backlight unit 220 is physically and thermally attached to an array tray 222. A heat spreader 224, such as a graphite sheet, is attached to the back of the array tray 222 opposite the backlight unit 220 to conduct heat rapidly away therefrom and to equalize temperatures throughout the backlight unit 220. By connecting directly to the array tray 222 to which the backlight unit 220 is physically and thermally attached, the heat spreader 224 thermally integrates therewith, including with the tiles in the backlight unit 220.

Beneath the heat spreader 224 are two LED driver circuit boards 226, one on either side of the display assembly 102. Beneath one of the LED driver circuit boards 226, toward one side of the display assembly 102, is an LCD controller power control board 228 that is protected by an LCD controller shield 230 therebeneath. An LED power supply 232 is attached beneath the other LED driver circuit board 226 on the other side of the display assembly 102, opposite the LCD controller power control board 228. An LED power supply insulator 234 protects the LED power supply 232.

Figure 3:
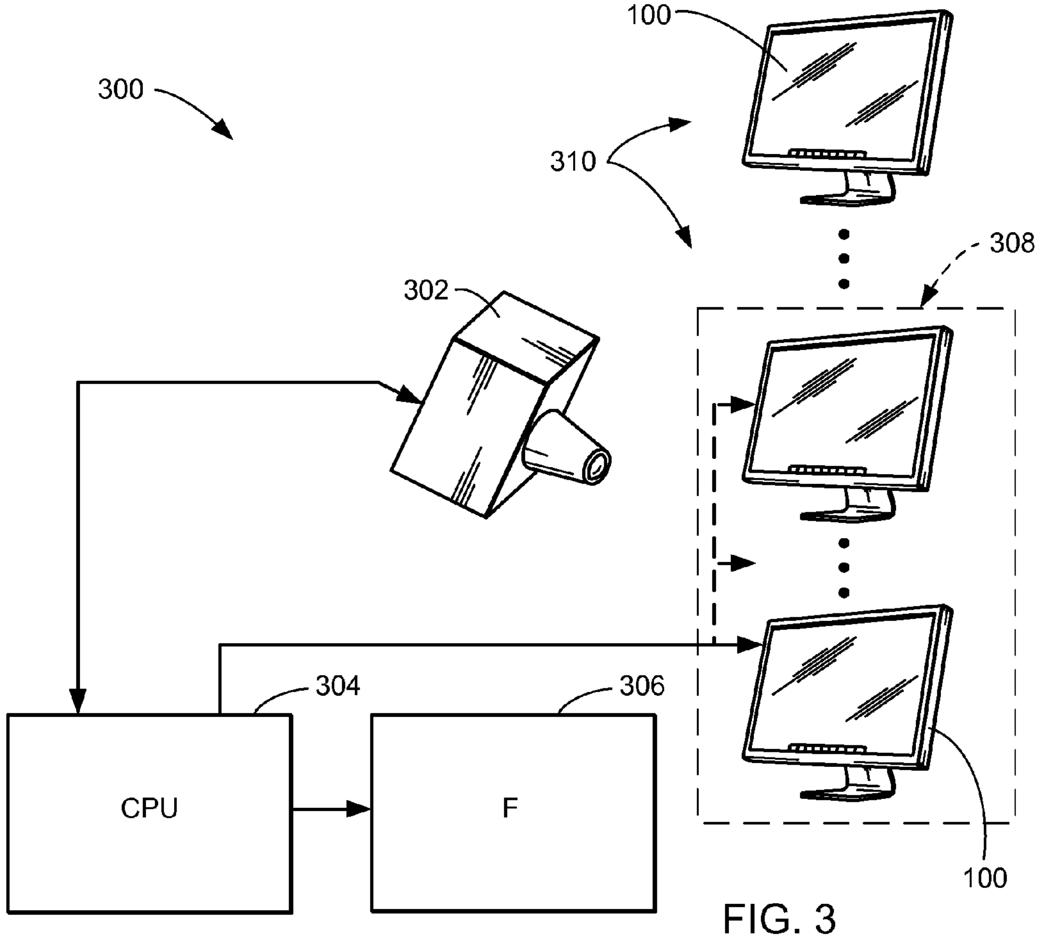
FIG. 3 is a view of an initial calibration system in accordance with an embodiment of the present invention.

Referring now to FIG. 3, therein is shown an initial calibration system 300. The initial calibration system 300 includes a measurement unit 302 that is connected to and controlled by a central processing unit ("CPU") 304. The CPU 304 generates a dependency function F 306 by controlling the measurement unit 302 to measure the color response and color response characteristics of a subset 308 of a family 310 of display units or display systems 100. An example of a family 310 of the display systems 100 would be, for instance, display systems 100 all of which are identical and are identified by a common manufacturer's model number.

In order to derive the dependency function F 306, the number of the display systems 100 in the subset 308 might be very few in number (e.g., 5-10) for a display family 310 in which the display performance and color response characteristics of the individual display systems 100 are highly consistent across the entire display family 310. In other circumstances, where the individual display systems 100 exhibit considerable variability one-to-another, the subset 308 might contain several times that number, perhaps even into the hundreds. The size of the subset 308 will accordingly be selected in response to the inherent display family 310 product consistency, and in response to the desired precision for the dependency function F 306.

Under the control of the CPU 304, therefore, the measurement unit 302 and the subset 308 of the display systems 100 are controlled to perform a large set of measurements $N_2$ (see 902 in FIG. 9) on the subset 308 to fully characterize the display systems 100 therein according to the parameters and characteristics of interest. From this data, the CPU 304 derives the dependency function F 306 for the entire display family 310, as described more fully in connection with FIG. 9.

Figure 4:
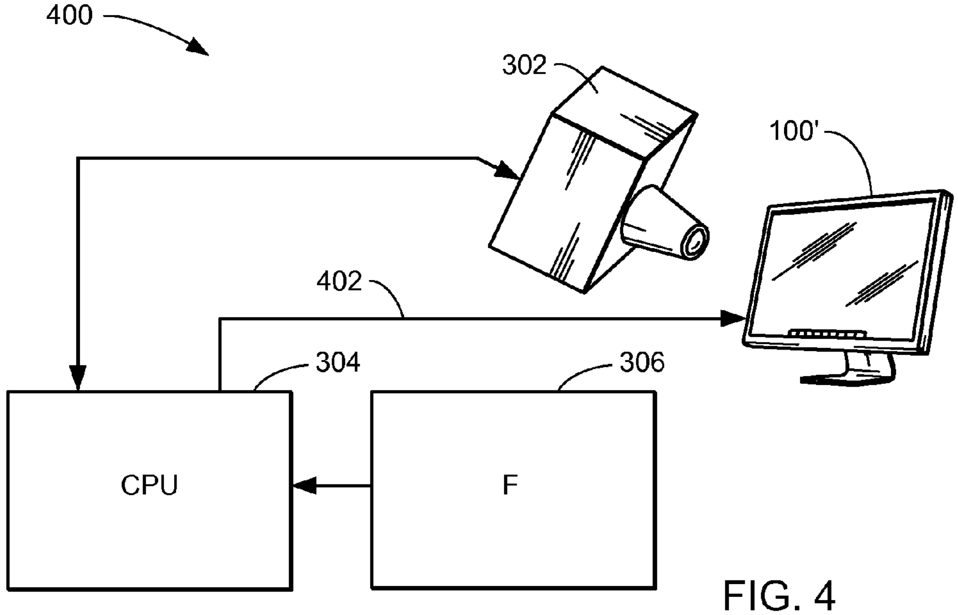
FIG. 4 is a view of a production calibration system in accordance with an embodiment of the present invention.

Referring now to FIG. 4, therein is shown a production calibration system 400. Having derived the dependency function F 306, it is now possible, as explained more fully hereinbelow, to fully characterize an individual display system 100' from the family 310 using but a small set of measurements $N_1$ (see 904 in FIG. 9).

The CPU 304 accordingly operates the measurement unit 302 and the individual display system 100' to obtain a small set of individual measurements $N_1$ (see 906 in FIG. 9). Then, using the dependency function F 306, the CPU 304 fully characterizes the individual display system 100'. The results of that characterization may be stored internally in the individual display system 100', such as through a control line 402, or may be stored externally, according to the particular circumstances and application considerations at hand. Similarly, the form of the stored characterization may be selected according to the preferences of the user, for example, as a conventional calibration table, or as the small set of individual measurements $N_1$ along with the dependency function F 306 (for dynamically deriving calibration values as needed), and so forth.

The initial calibration system 300 (FIG. 3) thus characterizes the overall color response of a display family 310 of the display systems 100, and determines the idiosyncratic color response characteristics of the display family 310, characterizing the idiosyncratic color response results into the dependency function F 306. In one embodiment, each measurement constitutes a color response point, so that the dependency function F 306 then relates the idiosyncratic color response characteristics of the display family 310 to respective idiosyncratic color response points. These idiosyncratic color response points correspond to the small set of measurements $N_1$ (904 in FIG. 9)

In the production line, the production calibration system 400 (FIG. 4) then measures the individual display system 100', which is an individual member of the display family 310. Only the values of the idiosyncratic color response points (the small set of individual measurements $N_1$ (906 in FIG. 9)) are measured. Utilizing these measured values and the dependency function F 306, as explained further hereinbelow, a large set of measurements* $N_2$ (see 910 in FIG. 9) is recovered, from which the full color response of the individual display system 100' is then specified, such as by the CPU 304. In other words, the full color response of the individual member of the display family 310 is ultimately specified from the small set of measured individual idiosyncratic color response point values of the individual member of the display family 310 and from the overall objective color response of the display family 310 (as captured in the dependency function F 306). This specification is achieved by applying the individual idiosyncratic color response point values of the individual member of the display family 310 to the overall objective color response of the display family 310.

Figure 5:
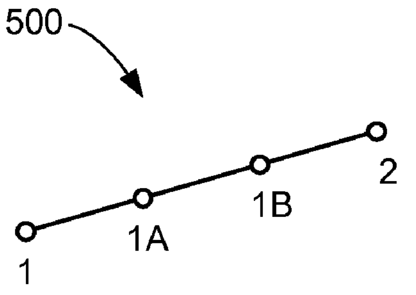
FIG. 5 is a view of a linear system depicting measurement points.

Referring now to FIG. 5, therein is shown a linear system 500 depicting points or values 1, 1A, 1B, and 2 intended, in connection with the next several FIGs., to explain the operation of the dependency function F 306. Therefore, while depicted in the abstract, the points 1, 1A, 1B, and 2 in the linear system 500 may represent, for example, successive color value measurements of a subset 308 (FIG. 3) in a display system having a linear response at least in the region that is being measured by the points 1, 1A, 1B, and 2.

Figure 6:
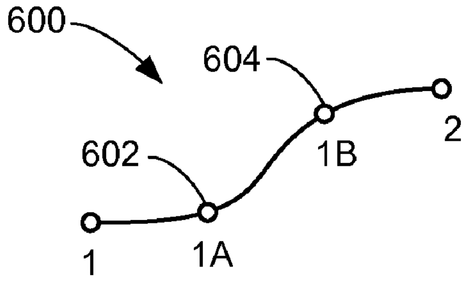
FIG. 6 is a depiction similar to that of FIG. 5 of a non-linear system.

Referring now to FIG. 6, therein is shown a depiction, similar to that in FIG. 5, of color value measurements of a subset 308 (FIG. 3) in a non-linear system 600. In this case, the measurement points 1 and 2 correspond to those in FIG. 5. However, the measurement points 1A and 1B, in between points 1 and 2, have exhibited non-linear behaviors. The non-linear behaviors, as depicted in this example, have resulted in a lower than expected measured value for point 1A and a higher than expected measured value for point 1B.

It will be understood, of course, that there can be any number of reasons for these non-linear results for points 1A and 1B. For purposes of the present description, it will be assumed that the (lower) value for point 1A is a result of an overall objective color response 602 that is shared in common by all of the display systems 100 in the display family 310. In like fashion, it will be assumed that the (higher) response for point 1B does not always appear for every display system 100 in the display family 310. Thus, point 1B may typically present various different values for various individual display system members 100' of the display family 310. Accordingly, point 1B depicts an idiosyncratic color response point 604 for the display family 310. The overall objective color response 602 information and the idiosyncratic color response point 604 information has then been incorporated into the dependency function F 306.

Figure 7:
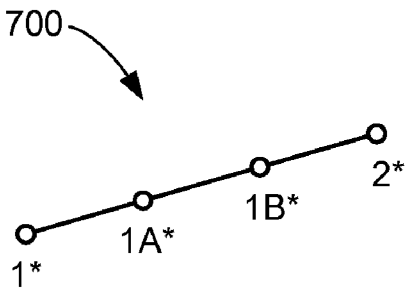
FIG. 7 is a depiction of a linear system interpolation for the linear system data shown in FIG. 5.

Referring now to FIG. 7, therein is shown a depiction of a linear system interpolation 700 for the linear system 500 data shown in FIG. 5. Because the data is linear, the values for points 1A and 1B (FIG. 5) do not need to be stored for the corresponding individual member of the display family 310. Rather, using stored values 1* and 2*, corresponding to the points 1 and 2 in FIG. 5, the values for 1A* and 1B* can be readily interpolated, as will be understood by one of ordinary skill in the art.

Figure 8:
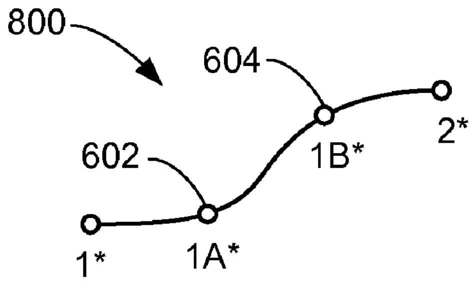
FIG. 8 is a depiction of a dependency function interpolation for the non-linear system data of FIG. 6.

Referring now to FIG. 8, therein is depicted a dependency function interpolation 800, according to the present invention, for the non-linear system 600 data depicted in FIG. 6. The dependency function interpolation 800 would be utilized, for example, to record and recover calibration values for an individual member of the display family 310, such as the individual display system 100' (FIG. 4). In this case, the values 1* and 2* in FIG. 8 have been stored during the production calibration illustrated in FIG. 4. The values 1* and 2* correspond to the points 1 and 2 in FIG. 6. However, for the dependency function interpolation 800, the dependency function F 306 is utilized to interpolate the values for points 1A* and 1B* in FIG. 8. As a result, the color response of the individual member of the display family 310 can be utilized to derive intermediate values (e.g., points 1A* and 1B*) between measured values (e.g., the stored values 1* and 2*) of the individual member of the display family 310.

To interpolate the value for point 1A*, the overall objective color response 602 information in the dependency function F 306 is utilized. The value for point 1A* in FIG. 8 is readily determined without reference to or need for specific stored information about point 1A* for the individual member of the display family 310. Such stored information is not needed because the information is common to the entire display family 310 and is therefore contained inherently within the dependency function F 306.

On the other hand, the dependency function F 306 will incorporate knowledge that the value of point 1B* is to be determined using stored information about the value of the idiosyncratic color response point 604. In particular, rather than directly interpolating from the points 1* and 2*, the dependency function F 306 will obtain the value for point 1B* in FIG. 8 by consulting the specific stored 1B* individual idiosyncratic color response point value of the individual member of the display family 310, having been instructed to do so by the dependency function F 306 that recognizes that point 1B* is an idiosyncratic color response point 604.

Based on this disclosure, it will now be clear to one of ordinary skill in the art that FIGS. 5-8 are illustrative simplifications, and that in fact a larger number of measurement points will ordinarily be involved. A particular significance in these comparison figures is that the non-linear system depicted in FIGS. 6 and 8 can produce an exact reproduction of the measured values in FIG. 6 without requiring non-linear points corresponding to point 1A to be specifically measured and stored for the individual members of the display family 310. With a large number of measurement points, if the individual members of the display family 310 have fairly consistent response characteristics, a significant majority of measurements may be of the objective overall color response 602 category (i.e., of the point 1A type), and very few idiosyncratic color response points 604 (i.e., of the point 1B type) will need to be measured. This represents a very substantial improvement over previous techniques where compromises were forced between accuracy, which required large data measurement and storage, or approximations, which reduced the accuracy of the display device calibration.

Figure 9A:
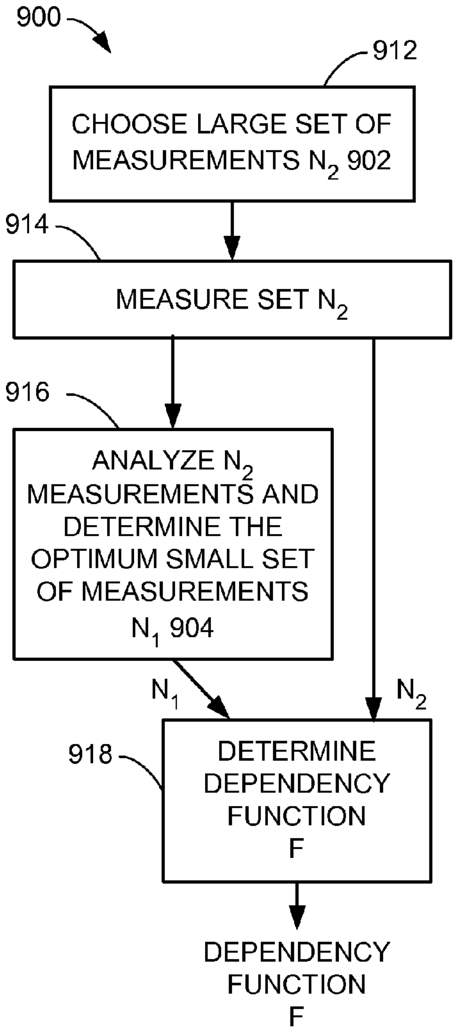
FIG. 9A-9C is a work flow depiction of the derivation and of the use of the dependency function F.
Figure 9B:
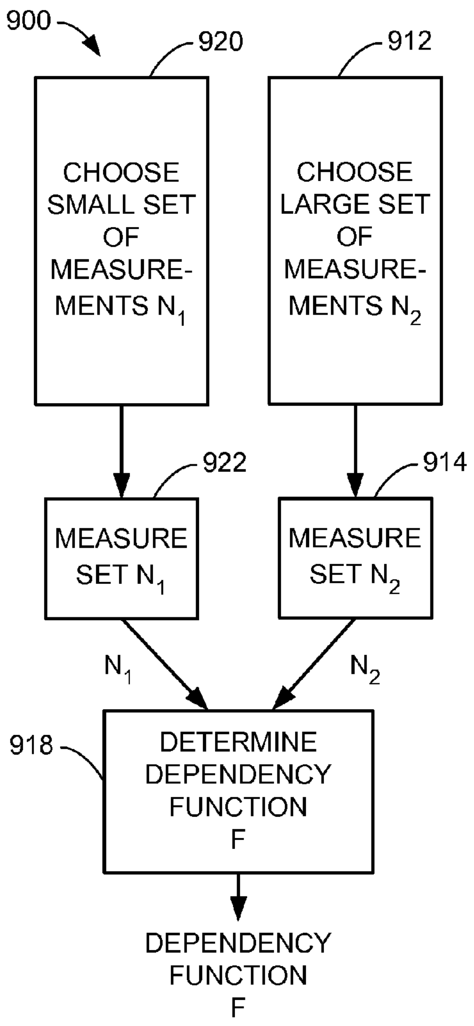
Figure 9C:
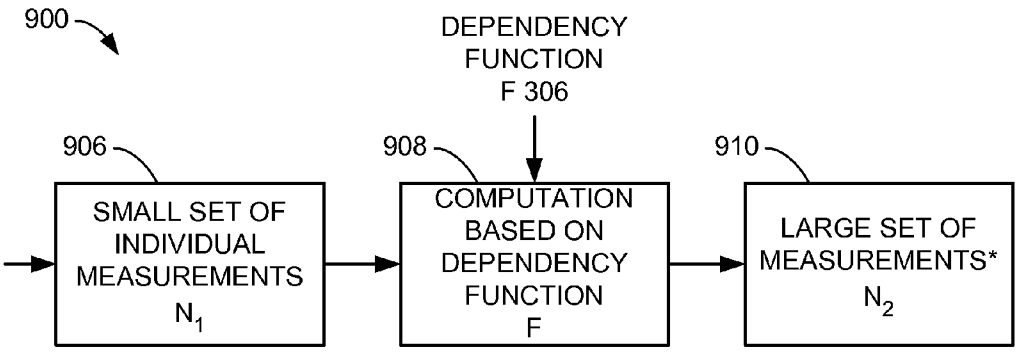

Referring now to FIGS. 9A, 9B, and 9C, therein is depicted a workflow 900. The workflow 900 depicts the use of a large set of measurements $N_2$ 902 and a small set of measurements $N_1$ 904 to derive the dependency function F 306. One embodiment of a portion of the workflow 900 is depicted in FIG. 9A and another is depicted in FIG. 9B.

The remainder of the workflow 900 is shown in FIG. 9C and depicts the use of the dependency function F 306 and a small set of individual measurements $N_1$ 906 to perform a computation 908 to recover a large set of measurements* $N_2$ 910.

The small set of measurements $N_1$ 904 are the idiosyncratic color response points for the display family 310 (FIG. 3). The small set of individual measurements $N_1$ 906 are the individual idiosyncratic color response point values of an individual member of the display family 310. The recovered large set of measurements* $N_2$ 910 then enables a complete characterization of the particular individual member of the display family 310 to be specified.

(The large set of measurements* $N_2$910 is identified with an asterisk to indicate that these are measurement "equivalents", with values effectively the same as if actual measurements had been made, but recognizing that they are not "measurements" per se, but are equivalent values that have been generated by the computation 908 in lieu of actual measurements.)

In the embodiment depicted in FIG. 9A, the large set of measurements $N_2$ 902 is used to determine and specify the small set of measurements $N_1$ 904. These measurements are then used together to derive or determine the dependency function F 306. The large set of measurements $N_2$ 902 is first chosen in a block 912 and measured in a block 914. The measurements are then analyzed in a block 916 to determine the optimum small set of measurements $N_1$ 904. The large set of measurements $N_2$ 902 and the small set of measurements $N_1$ 904 are then utilized to specify and determined the dependency function F 306 in a block 918.

In one embodiment, known statistical methodologies are used to determine which of the large set of measurements $N_2$ 902 are statistically significant. Such statistically significant measurements are generally more likely to provide sensitive metrics for capturing and specifying the idiosyncratic differences from one individual member of the display family 310 to another, and are accordingly used to define and determine the optimum small set of measurements $N_1$ 904.

In another embodiment, depicted in FIG. 9B, the small set of measurements $N_1$ 904 is separately chosen in a block 920 and measured in a block 922. The measured values for the large set of measurements $N_2$ 902 and the small set of measurements $N_1$ 904 are then utilized to specify and determined the dependency function F 306 in the block 918.

As described above, the large set of measurements $N_2$ 902 is used in deriving the dependency function F 306, wherein the overall color response of the display family 310 is then characterized and the idiosyncratic color response characteristics of the display family 310 are determined and specified. This then leads to the result that only the individual idiosyncratic color response point values need to be determined for an individual member of a display family 310 in order to completely characterize that individual member. Those idiosyncratic color response points represent a much smaller set of measurements $N_1$ 904. This determination is used in the derivation, specification, and definition of the dependency function F 306 and is incorporated into the dependency function F 306.

Having determined the idiosyncratic color response points, and referring to FIGS. 4 and 9C, the individual member (the individual display system 100') of the display family 310 is then measured in a production environment to determine the actual values of those idiosyncratic color response points for that particular display. Only the small set of individual measurements $N_1$ 906 needs to be measured, thereby capturing the idiosyncratic color response point values of the individual member of the display family 310. This much smaller set of idiosyncratic color response point value measurements is then utilized, in conjunction with the dependency function F 306 as described, to produce an accurate visual rendition of display signals that are subsequently input into the display system 100' (FIG. 4).

Thus, to provide the full suite of color compensation values, the display system 100 has needed to record only the idiosyncratic color response point values, that is, the small set of individual measurements $N_1$ 906, which is then consulted as needed to perform the computation 908. This in turn enables reproduction of the full, large set of measurements* $N_2$ 910, thereby providing full and accurate device calibration for the particular individual display system 100'.

With respect to the present invention, it will of course be understood that the term "color" is defined to include gray scale values along with other displayed colors, including black and white. It will also be understood that the overall objective color response of a display family 310 is defined to mean those responses that are common to all the members of the display family 310 and are not unit-dependent, that is, not idiosyncratic uniquely to just an individual display system 100'.

It will also be understood that "blended" systemic and idiosyncratic measurements and responses are encompassed as well by the present invention, such as, for example, calibration off-sets wherein a subset of idiosyncratic values may characterize a portion of the overall color response of the display family, such as by one or more system-wide offset values.

Referring again to FIGS. 5-9 and the associated descriptions, it will now also be clear to one of ordinary skill in the art that the dependency function F 306 is not necessarily limited to a one- or two-dimensional function. Thus, depending upon the complexities of the display systems 100 that are involved, and the degrees of interdependence and/or independence of the various measurement and calibration factors, the overall objective color response of the display family 310 may be a continuous or discontinuous mathematical function, and may encompass many dimensions. Thus, for example, the dependency function F 306 might define an n-dimensional curve, or a multi-dimensional surface, and so forth. Then, in one embodiment, the continuous or discontinuous mathematical function may be conformed to substantially match the individual idiosyncratic color response points of the individual members of the display family 310.

It will also be understood that the overall objective color response and the idiosyncratic color response points may be utilized for full color calibration of the individual members of the display family, as described, or may be limited, for example, to gray level calibration of the individual members of the display family.

Additionally, depending upon the individual characteristics of the particular display family (i.e., those characteristics of the display family that are common to all members of the family, but individual to that family as distinguished from another family), the range of the overall objective color response and the idiosyncratic color response points may be substantially the same or may be different. Thus, whereas the overall objective color response and the idiosyncratic color response points in many cases will be contained within substantially the same range, it may happen that the idiosyncratic color response points of interest occur only in a limited or different range from the overall objective color response.

It will also be understood and appreciated that the present invention can be utilized for calibrating and controlling a wide range of LED-illuminated displays, including, for example, TFT LCD displays.

It will be additionally understood that, although the CPU 304 has been described as performing many of the analytical and control functions described in the present disclosure, the CPU is not the only circuitry herein that can be utilized for these purposes. Thus, circuitry for characterizing the overall objective color response, for determining the idiosyncratic color response characteristics, for relating the idiosyncratic color response characteristics to color response points, for specifying color responses, for representing, for conforming, for utilizing, and so forth, may be incorporated in and provided by the CPU 304 and its customary peripherals (not shown). Alternatively, or in addition, some of the circuitry for these functions may be provided by and incorporated in the display systems 100, for example, or in other circuitry components as appropriate or desired.

It has been unexpectedly discovered that statistical analysis methodologies are particular efficacious for identifying those measurements that appropriately belong to the overall objective color response of the display family and those that are more appropriately ascribed to the idiosyncratic color response characteristics of the display family. Accordingly, characterizing the overall objective color response of a display family and determining the idiosyncratic color response characteristics of the display family can be advantageously performed by first making statistically significant measurements on members of a statistically significant subset of the display family and then statistically analyzing the measurements to derive the overall objective color response of the display family and the idiosyncratic color response characteristics of the display family.

A suitable such statistical analysis, for example, is to determine the standard deviations σ from the several measurement point values, then determine which of the values produce the lower standard deviations according to a standard selected appropriately to the production and calibration results desired, and assigning the corresponding measurements to the overall objective color response characterization. A determination is then also made as to which of the measurements produce the higher standard deviations, and those are assigned to the idiosyncratic color response points.

A similar statistical methodology may be followed in another embodiment, for example, by selecting a set σ value and then determining the idiosyncratic color response characteristics of the display family that should not be included in the overall objective color response of the display family in order to keep the overall objective color response of the display family to a value that is less than the set σ value. Those excluded characteristic points are then included in the idiosyncratic response points.

The present invention thus also provides particularly efficient ways to generate the full color response of the individual members of the display family, so that it can be utilized to apply an inverse compensation to a video signal to assure faithful rendition of the color signals.

As noted above, multi-dimensional characterizations may be utilized, for example, for determining independent color responses or response functions such as $f_R$, $f_G$, and $f_B$ for each R, G, and B color channel.

In some cases it will be noted, for example as a result of a statistical analysis, that some characteristics of the displays may be related functionally to other characteristics of the displays such that the former may be defined as functions of the latter.

It will also be appreciated, inasmuch as the individual members of the display family can be characterized by measuring only substantially the individual idiosyncratic color response points, that the color responses of the individual members of the display family can be characterized in less time than the time for measuring all of the color response points, by measuring only a reduced set of points that includes substantially the individual idiosyncratic color response points.

It will also be clear now to one of ordinary skill in the art based on the teachings of the present invention that further savings in production costs can be realized by appropriately relaxing production constraints on production factors that are substantially independent of the idiosyncratic color response points.

Figure 10:
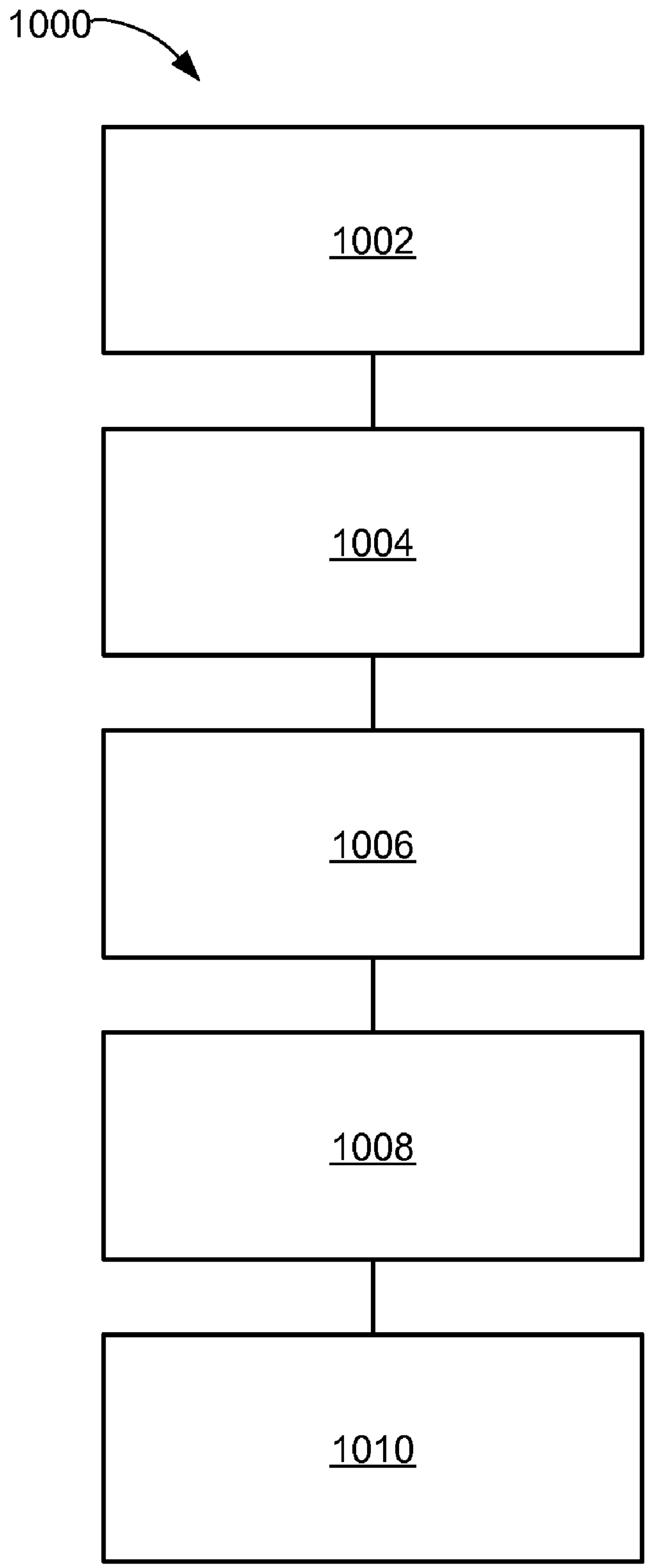
FIG. 10 is a flow chart of a system for display device calibration in an embodiment of the present invention.

Referring now to FIG. 10, therein is shown a flow chart of a system 1000 for display device calibration in an embodiment of the present invention. The system 1000 includes characterizing the overall color response of a display family in a block 1002; determining the idiosyncratic color response characteristics of the display family in a block 1004; relating the idiosyncratic color response characteristics of the display family to respective idiosyncratic color response points in a block 1006; determining individual idiosyncratic color response point values for an individual member of the display family in a block 1008; and specifying the color response of the individual member of the display family from the individual idiosyncratic color response point values of the individual member of the display family and the overall color response of the display family in a block 1010.

It has been discovered that the present invention thus has numerous aspects.

A principle aspect that has been unexpectedly discovered is that the present invention provides better and more efficient display device calibration systems for easily, quickly, efficiently, and economically calibrating large numbers of display devices, such as in high-speed, volume-manufacturing environments.

Another aspect is that the present invention provides an excellent, consistent, and affordable consumer experience by enabling the efficient, high-speed manufacture of LED-illuminated larger-sized displays that are easy and inexpensive to manufacture and low in cost, and quickly and accurately calibrated with uniform color performance characteristics.

An important aspect is thus that the present invention significantly facilitates the replacement of CCFL light sources with LED light sources in commercial consumer applications.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the reduced measurement display device calibration system of the present invention furnishes important and heretofore unknown and unavailable solutions, capabilities, and functional aspects for easily, quickly, efficiently, and economically calibrating large numbers of display devices in a high-speed, volume-manufacturing environment. The resulting processes and configurations are straightforward, cost-effective, uncomplicated, highly versatile, accurate, sensitive, and effective, can be surprisingly and unobviously implemented by adapting known technologies, and are thus readily suited for efficiently and economically manufacturing reduced measurement display device calibration systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A display device calibration system, comprising:

a processor adapted to execute instructions stored within a memory module; and a memory module connected to the processor and containing:

a first set of instructions for characterizing the overall color response of a display family;

a second set of instructions for determining the idiosyncratic color response characteristics of the display family;

a third set of instructions for relating the idiosyncratic color response characteristics of the display family to respective idiosyncratic color response points;

a fourth set of instructions for determining individual idiosyncratic color response point values for an individual member of the display family; and a fifth set of instructions for specifying the color response of the individual member of the display family from:

the individual idiosyncratic color response point values of the individual member of the display family; and the overall color response of the display family.

2. The system as claimed in claim 1, wherein the memory module further comprises a sixth set of instructions for representing the overall color response of the display family as a function that defines an n-dimensional curve.

3. The system as claimed in claim 1, wherein the memory module further comprises a sixth set of instructions for representing the overall color response of the display family as a function that defines a multi-dimensional surface.

4. The system as claimed in claim 1, wherein the memory module further comprises:

a sixth set of instructions for representing the overall color response of the display family as a function that defines an n-dimensional curve; and a seventh set of instructions for conforming the function to match the individual idiosyncratic color response points of the individual member of the display family.

5. The system as claimed in claim 1, wherein the memory module further comprises:

a sixth set of instructions for representing the overall color response of the display family as a function that defines a multi-dimensional surface; and a seventh set of instructions for conforming the function to match the individual idiosyncratic color response points of the individual member of the display family.

6. The system as claimed in claim 1 wherein the overall color response and the idiosyncratic color response points are contained within the same range.

7. The system as claimed in claim 1, wherein the memory module further comprises a sixth set of instructions for utilizing the color response of the individual member of the display family to derive intermediate values between measured individual idiosyncratic color response point values of the individual member.

8. The system as claimed in claim 1, wherein the memory module further comprises a sixth set of instructions for determining independent color responses $f_R$, $f_G$, and $f_B$ for each R, G, and B color channel.

9. The system as claimed in claim 1, wherein the memory module further comprises a sixth set of instructions for defining a characteristic of a set of displays as a function of another characteristic of the set of displays.

10. The system as claimed in claim 1 wherein the fifth set of instructions is adapted to specify the color response of an individual member of the display family by using measurements from a reduced set of points, wherein the reduced set of points contains the individual idiosyncratic color response points.

11. The system as claimed in claim 1, wherein the memory module further comprises a sixth set of instructions for storing information concerning the overall color response of the display family and information concerning the idiosyncratic color response characteristics of the display family.

12. The system as claimed in claim 1 wherein the memory module further comprises a sixth set of instructions for:

receiving measurements taken from members of the display family; and statistically analyzing the measurements to derive the overall color response of the display family and the idiosyncratic color response characteristics of the display family.

13. The system as claimed in claim 1 wherein the memory module further comprises a sixth set of instructions for:

receiving measurements of color response measurement points of a predetermined number of members of the display family; and determining which of the measurement points are common to the overall color response, and which of the measurement points are idiosyncratic, by:

determining the standard deviations of the measurement point measurements;

determining which of the measurements produce the lower standard deviations and assigning them to the overall color response characterization, and determining which of the measurements produce the higher standard deviations and assigning them to the idiosyncratic color response points.

14. The system as claimed in claim 1, wherein the memory module further comprises a sixth set of instructions for determining the idiosyncratic color response characteristics of the display family to achieve a standard deviation σ in the overall color response of the display family that is less than a predetermined σ value.

15. The system as claimed in claim 1, wherein the memory module further comprises a sixth set of instructions for determining the idiosyncratic color response characteristics of the display family to achieve a standard deviation σ in the overall color response of the display family that is less than a predetermined σ value, by identifying those color response points in the overall color response of the display family that have σ values above a predetermined value and incorporating those identified color response points into the idiosyncratic color response characteristics of the display family.

16. A display device calibration system, comprising:

means for characterizing the overall color response of a display family;

means for determining the idiosyncratic color response characteristics of the display family;

circuitry for relating the idiosyncratic color response characteristics of the display family to respective idiosyncratic color response points;

means for determining individual idiosyncratic color response point values for an individual member of the display family; and circuitry for specifying the color response of the individual member of the display family from:

the individual idiosyncratic color response point values of the individual member of the display family; and the overall color response of the display family.

17. The system as claimed in claim 16 further comprising circuitry for representing the overall color response of the display family as a function that defines an n-dimensional curve.

18. The system as claimed in claim 16 further comprising circuitry for representing the overall color response of the display family as a function that defines a multi-dimensional surface.

19. The system as claimed in claim 16 further comprising:

circuitry for representing the overall color response of the display family as a function that defines an n-dimensional curve; and circuitry for conforming the function to match the individual idiosyncratic color response points of the individual member of the display family.

20. The system as claimed in claim 16 further comprising:

circuitry for representing the overall color response of the display family as a function that defines a multi-dimensional surface; and circuitry for conforming the function to match the individual idiosyncratic color response points of the individual member of the display family.

21. The system as claimed in claim 16 further comprising circuitry for utilizing the overall color response and the idiosyncratic color response points for gray level calibration of the individual member of the display family.

22. The system as claimed in claim 16 further comprising circuitry for utilizing the overall color response and the idiosyncratic color response points for color calibration of the individual member of the display family.

23. The system as claimed in claim 16 wherein the overall color response and the idiosyncratic color response points are contained within the same range.

24. The system as claimed in claim 16 further comprising circuitry for calibrating and controlling a TFT LCD display.

25. The system as claimed in claim 16 further comprising circuitry for utilizing the color response of the individual member of the display family to derive intermediate values between measured individual idiosyncratic color response point values of the individual member.

26. The system as claimed in claim 16 further comprising circuitry for utilizing the color response of the individual member of the display family to apply an inverse compensation to a video signal.

27. The system as claimed in claim 16 further comprising circuitry for determining independent color responses $f_R$, $f_G$, and $f_B$ for each R, G, and B color channel.

28. The system as claimed in claim 16 further comprising circuitry for defining a characteristic of a set of displays as a function of another characteristic of the set of displays.

29. The system as claimed in claim 16 further comprising means for characterizing the color response of an individual member of the display family in less time than the time for measuring all the color response point values of the individual member of the display family by measuring only a reduced set of points that includes the individual idiosyncratic color response points.

30. The system as claimed in claim 16 further comprising means for storing information concerning the overall color response of the display family and information concerning the idiosyncratic color response characteristics of the display family externally to individual members of the display family.

31. The system as claimed in claim 16 further comprising means for storing information concerning the overall color response of the display family and information concerning the idiosyncratic color response characteristics of the display family internally in individual members of the display family.

32. The system as claimed in claim 16 wherein the means for characterizing the overall color response of a display family and the means for determining the idiosyncratic color response characteristics of the display family further comprise:

means for making measurements on members of the display family; and circuitry for statistically analyzing the measurements to:

derive the overall color response of the display family; and the idiosyncratic color response characteristics of the display family.

33. The system as claimed in claim 16 wherein the means for characterizing the overall color response of a display family and the means for determining the idiosyncratic color response characteristics of the display family further comprise:

means for making measurements of color response measurement points of a predetermined number of members of the display family; and circuitry for determining which of the measurement points are common to the overall color response, and which of the measurement points are idiosyncratic, by:

determining the standard deviations of the measurement point measurements;

determining which of the measurements produce the lower standard deviations and assigning them to the overall color response characterization, and determining which of the measurements produce the higher standard deviations and assigning them to the idiosyncratic color response points.

34. The system as claimed in claim 16 further comprising circuitry for determining the idiosyncratic color response characteristics of the display family to achieve a standard deviation σ in the overall color response of the display family that is less than a predetermined σ value.

35. The system as claimed in claim 16 further comprising circuitry for determining the idiosyncratic color response characteristics of the display family to achieve a standard deviation σ in the overall color response of the display family that is less than a predetermined σ value, by identifying those color response points in the overall color response of the display family that have σ values above a predetermined value and incorporating those identified color response points into the idiosyncratic color response characteristics of the display family.

36. The system as claimed in claim 16 further comprising means for relaxing production constraints on production factors that are independent of the idiosyncratic color response points.

37. A display device calibration system, comprising:

means for characterizing the overall objective color response of a display family;

means for determining the idiosyncratic color response characteristics of the display family;

circuitry for relating the idiosyncratic color response characteristics of the display family to respective idiosyncratic color response points;

means for determining individual idiosyncratic color response point values for an individual member of the display family;

circuitry for uniquely specifying the color response of the individual member of the display family from:

the individual idiosyncratic color response point values of the individual member of the display family; and the overall objective color response of the display family by applying the individual idiosyncratic color response point values of the individual member of the display family to the overall objective color response of the display family; and circuitry for reconstructing at least a portion of the color response of the individual member of the display family from the individual idiosyncratic color response point values of the individual member of the display family.

38. The system as claimed in claim 37 further comprising circuitry for representing the overall objective color response of the display family as a continuous mathematical function that defines an n-dimensional curve.

39. The system as claimed in claim 37 further comprising circuitry for representing the overall objective color response of the display family as a continuous mathematical function that defines a multi-dimensional surface.

40. The system as claimed in claim 37 further comprising:

circuitry for representing the overall objective color response of the display family as a continuous mathematical function that defines an n-dimensional curve; and circuitry for conforming the continuous mathematical function to match the individual idiosyncratic color response points of the individual member of the display family.

41. The system as claimed in claim 37 further comprising:

circuitry for representing the overall objective color response of the display family as a continuous mathematical function that defines a multi-dimensional surface; and circuitry for conforming the continuous mathematical function to match the individual idiosyncratic color response points of the individual member of the display family.

42. The system as claimed in claim 37 further comprising circuitry for utilizing the overall objective color response and the idiosyncratic color response points for gray level calibration of the individual member of the display family.

43. The system as claimed in claim 37 further comprising circuitry for utilizing the overall objective color response and the idiosyncratic color response points for color calibration of the individual member of the display family.

44. The system as claimed in claim 37 wherein the overall objective color response and the idiosyncratic color response points are contained within the same range.

45. The system as claimed in claim 37 further comprising circuitry for calibrating and controlling a TFT LCD display.

46. The system as claimed in claim 37 further comprising circuitry for utilizing the color response of the individual member of the display family to derive intermediate values between measured individual idiosyncratic color response point values of the individual member.

47. The system as claimed in claim 37 further comprising circuitry for utilizing the color response of the individual member of the display family to apply an inverse compensation to a video signal.

48. The system as claimed in claim 37 further comprising circuitry for determining independent color response functions $f_R$, $f_G$, and $f_B$ for each R, G, and B color channel.

49. The system as claimed in claim 37 further comprising circuitry for defining predetermined characteristics of a set of displays as functions of other characteristics of the set of displays.

50. The system as claimed in claim 37 further comprising means for characterizing the color response of an individual member of the display family in less time than the time for measuring all the color response point values of the individual member of the display family by measuring only a reduced set of points that includes the individual idiosyncratic color response points.

51. The system as claimed in claim 37 further comprising means for storing information concerning the overall objective color response of the display family and information concerning the idiosyncratic color response characteristics of the display family externally to individual members of the display family.

52. The system as claimed in claim 37 further comprising means for storing information concerning the overall objective color response of the display family and information concerning the idiosyncratic color response characteristics of the display family internally in individual members of the display family.

53. The system as claimed in claim 37 wherein the means for characterizing the overall objective color response of a display family and the means for determining the idiosyncratic color response characteristics of the display family further comprise:

making measurements on a subset of members of the display family; and statistically analyzing the measurements to:

derive the overall objective color response of the display family; and the idiosyncratic color response characteristics of the display family.

54. The system as claimed in claim 37 wherein the means for characterizing the overall objective color response of a display family and the means for determining the idiosyncratic color response characteristics of the display family further comprise:

means for making measurements of color response measurement points of a subset of members of the display family; and circuitry for determining which of the measurement points are common to the overall objective color response, and which of the measurement points are idiosyncratic, by:

determining the standard deviations of the measurement point measurements;

determining which of the measurements produce the lower standard deviations and assigning them to the overall objective color response characterization, and determining which of the measurements produce the higher standard deviations and assigning them to the idiosyncratic color response points.

55. The system as claimed in claim 37 further comprising circuitry for determining the idiosyncratic color response characteristics of the display family to achieve a standard deviation σ in the overall objective color response of the display family that is less than a predetermined Y value.

56. The system as claimed in claim 37 further comprising circuitry for determining the idiosyncratic color response characteristics of the display family to achieve a standard deviation σ in the overall objective color response of the display family that is less than a predetermined σ value, by identifying those color response points in the overall objective color response of the display family that have σ values above a predetermined value and incorporating those identified color response points into the idiosyncratic color response characteristics of the display family.

57. The system as claimed in claim 37 further comprising means for relaxing production constraints on production factors that are independent of the idiosyncratic color response points.

* * * * *

UNITED STATES PATENT AND TRADEMARK OFFICE

CERTIFICATE OF CORRECTION

PATENT NO. : 7,777,755 B2
APPLICATION NO. : 11/766774
DATED : August 17, 2010
INVENTOR(S) : Gabriel G. Marcu et al.

It is certified that error appears in the above-identified patent and that said Letters Patent is hereby corrected as shown below:

In column 4, line 52, delete "FIG." and insert -- FIGS. --, therefor.

In column 8, line 59, after "9)" insert -- . --.

In column 10, line 65, delete "$N_2$910" and insert -- $N_2$ 910 --, therefor.

In column 20, line 45, in claim 55, delete "Y" and insert -- σ --, therefor.

Signed and Sealed this
Fifteenth Day of November, 2011

David J. Kappos
*Director of the United States Patent and Trademark Office*